(12) United States Patent
Goodpaster

(10) Patent No.: US 7,643,259 B2
(45) Date of Patent: Jan. 5, 2010

(54) SUBSTRATE, WITH ESD MAGNETICALLY INDUCED WIRES, BOUND TO PASSIVES/PRODUCT ICS

(75) Inventor: Harold D Goodpaster, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 214 days.

(21) Appl. No.: 11/513,539

(22) Filed: Aug. 31, 2006
(Under 37 CFR 1.47)

(65) Prior Publication Data
US 2008/0062601 A1 Mar. 13, 2008

(51) Int. Cl.
*H02H 9/00* (2006.01)
(52) U.S. Cl. .......................................... 361/56
(58) Field of Classification Search ................. 361/129, 361/56
See application file for complete search history.

(56) References Cited

U.S. PATENT DOCUMENTS

| | | | | |
|---|---|---|---|---|
| 5,578,944 A | * | 11/1996 | Sasaki | 326/86 |
| 5,953,636 A | * | 9/1999 | Keate et al. | 455/3.02 |
| 6,587,321 B2 | * | 7/2003 | Woo | 361/56 |
| 2002/0154462 A1 | * | 10/2002 | Ker et al. | 361/56 |
| 2005/0146821 A1 | | 7/2005 | Fjelstad et al. | |
| 2005/0285280 A1 | * | 12/2005 | Yau | 257/786 |
| 2006/0114130 A1 | * | 6/2006 | Lan et al. | 341/26 |
| 2006/0245126 A1 | * | 11/2006 | Loh et al. | 361/56 |

* cited by examiner

*Primary Examiner*—Stephen W Jackson
*Assistant Examiner*—Ann T Hoang
(74) *Attorney, Agent, or Firm*—Lawrence J. Bassuk; W. James Brady; Frederick J. Telecky, Jr.

(57) ABSTRACT

A device is protected from induced or unexpected current spikes or surges, by receiving the current spikes through a conducting wire. The conducting wire is placed adjacent to a parallel conducting wire having opposing current flow. Magnetic fluxes in either conducting wire create induced currents that reduce the current in the other conducting wire.

4 Claims, 4 Drawing Sheets

SUBSTRATE, WITH ESD MAGNETICALLY INDUCED WIRES, BOUND TO PASSIVES/PRODUCT ICS

BACKGROUND

Electronic devices, such as wireless telephones, personal digital assistants, audio/video devices, etc. include integrated circuits (IC) chips or product chips that provide functionality. A product chip may be bound to a printed circuit board or substrate which connects the product chip to other product chips and/or to system components (e.g., processors, memory, etc) of the device.

In certain situations, the device may experience a current spike. Such a current spike may be either induced, for example as part of a certification test, or experienced during use of a product, such as an electrostatic discharge (ESD) received by the device. Current spikes can be received through one of various electrical (i.e., conductive) inputs or input points that are exposed by the device. Examples of exposed input points, include power connectors, data connectors (i.e., connections to other devices), and user input points (e.g., keypads).

Following the fundamental equation of voltage=L di/dt, where L is inductance (i.e., magnetic flux) and di/dt is change of current over time, if a current spike is experienced, a proportionally large voltage spike is also experienced. Example values that may be seen include a 30 Amp current spike that translates to about an 8 kV voltage spike. Such current and associated voltage spikes can cause significant damage to the device.

In order to address problems presented by current spikes, a separate electrostatic discharge or ESD chip is provided with or configured to product chip. The ESD chip is designed to protect the product chip from any such current spikes, typically receiving and diverting (i.e., shunting) the current spike input away from the IC or product chip. The use of a separate ESD chip adds to the size of the device. For example, as new functionality and product chips are integrated into a device, the separate ESD chip or chips take up valuable real estate in the device. Therefore, as devices, such as smart phones, evolve and provide greater functionality, it becomes a challenge to reduce or maintain the size of devices, while introducing new and different product chips and ESD chips.

SUMMARY

In an embodiment, a device implements a chip assembly having a component that receives current surges or spikes from an exposed input of the device, and in effect drawing the current spike away from an integrated circuit chip. The reduce the current seen at the component, the current surge is received by one of multiple conducting lines that are placed parallel to one another and having opposing current flows. An induced current one conducting line has the effect of reducing the current in an adjacent conducting line.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE CONTENTS

DETAILED DESCRIPTION

Figure 1:
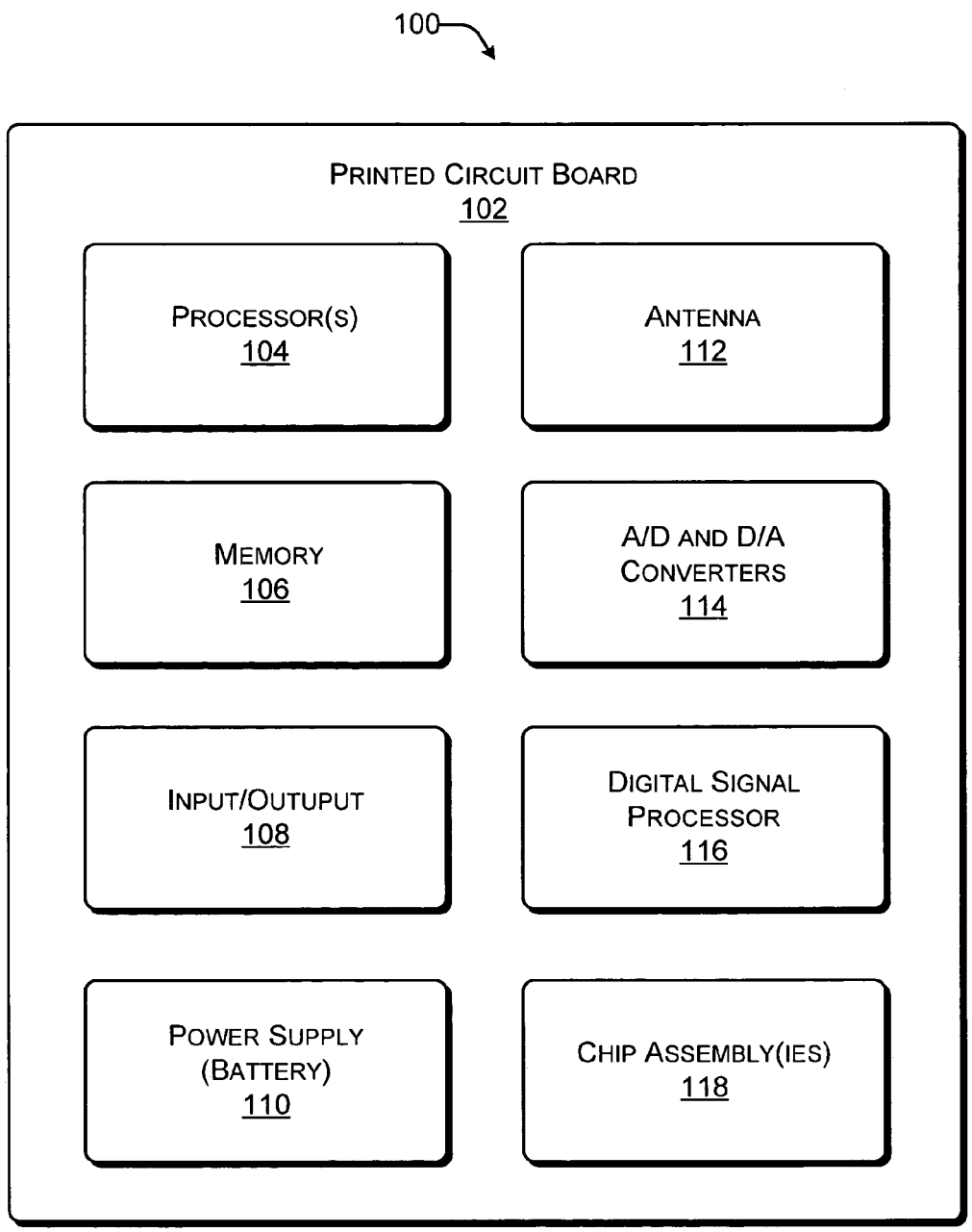
FIG. 1 illustrates a high level diagram of an exemplary system that implements magnetic techniques to address electrostatic discharge.

FIG. 1 is an exemplary high level diagram of a system or device 100 which includes magnetic techniques to address electrostatic discharge. The device 100 represents an embodiment of various systems and devices, including but not limited to wireless communication devices such as mobile, cellular, or smart phones telephones; personal digital devices; portable audio/video entertainment devices; and generally portable or mobile hand held devices. In particular, such devices may experience or receive electrostatic discharges (ESD) that translate to abnormal current spikes. Such ESD or current spikes are of relatively short duration; however, they have significant or large current values. The ESD or current spikes may be induced, for example, as part of a certification test for the device; or such ESD or current spikes may be unexpectedly received during use of the device. Such current spikes translate to voltage spikes that can potentially damage the system or device 100.

The device 100 may include a printed circuit board or PCB 102 that integrates or connects components that are described below of device 100. One of the components of device 100 includes one or more controllers or processor(s) 104, which may be connected through PCB 102. Various memory components as represented by memory 106 are included in device 100. Memory 106 may store machine or computer readable instructions and accessed or controlled by processor(s) 104. Memory 106 may include read only memory (ROM), random access memory (RAM), flash memory, and various media (e.g., compact disk, digital versatile disk, etc.).

Various analog and/or digital data inputs and outputs are represented by input/output 108. Input/output 108 includes contact points to user interfaces such as a keypad; device contact points such as input/output interfaces to external devices (e.g., USB connections), and external power connections. In specific, input/output 108 includes any input points which may receive an electrostatic discharge or current spike. The device 100 includes a battery or power supply 110 that provides internal power to device 100.

For embodiments where device 100 is a communication device, such as a mobile (i.e., cellular) telephone phone, an antenna 112 is provided to receive and send radio frequency (RF) signals. Analog to digital (A/D) converter and digital to analog (D/A) converter, included in A/D and D/A converters 114, respectively, convert the RF signals to digital data (when device 100 receives), and convert digital data to RF signals (when device 100 sends). A/D and D/A converters 114 may also support voice input (i.e., microphone), and convert the analog voice input into digital signals. Also digital data may be converted by A/D and D/A converters 114 to analog data played back on a speaker (not shown) of device 100.

Digital signals may be processed by a digital signal processor (DSP) 116. One of several functions performed by DSP 116 may include compressing and decompressing digital signals that are received and sent. In specific to a communication device, digital signal may be compressed to save bandwidth space during transmission; the DSP 116 compresses the digital signal before it is sent, and decompressing digital signals when they are received. DSP 116 may also perform modulation, demodulation, and error correction of digital signals.

The device 100 includes one or more chip assemblies 118. In certain embodiments, components such as processor 104, memory 106, A/D and D/A converters 104, and digital signal processor 106 may be included or configured as chip assemblies 118.

As further described below, each of the chip assemblies 118, is configured to include an integrated circuit (IC) or product chip, a "passives integration chip" or PIC, and may include a substrate. The PIC for each of the assemblies is particularly configured to receive potential current spikes by receiving potential current spikes from various input points of input/output 108 described above, protecting the product chip. The PIC, as described below, further provides parallel conducting wires or lines that reduce the effect of a large current spike.

Figure 2:
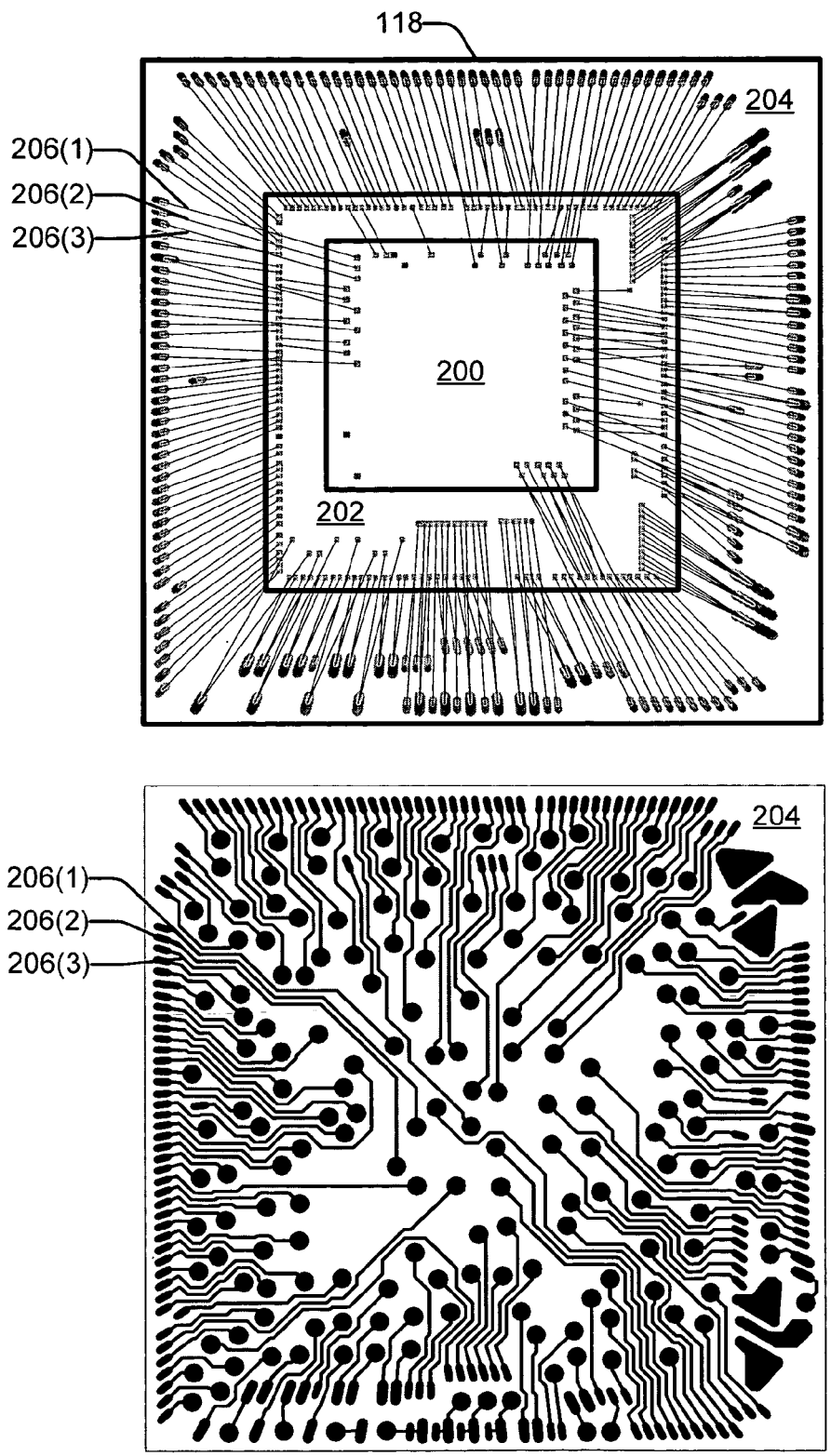
FIG. 2 illustrates a diagram of an exemplary chip assembly that implements a passives integration chip that protects against electrostatic discharge.

FIG. 2 shows an exemplary chip assembly 118 that implements a component, or passives integration chip (PIC) 200 that protects against electrostatic discharge. PIC 200 is bound to a product chip 202. Product chip 202 may be bound to a substrate 204. In certain embodiments, the substrate 204 is part of or connected to a PCB, such as PCB 102 of FIG. 1.

PIC 200 particularly includes inputs to various exposed points of a system or device (e.g., device 100) which may receive an electrostatic discharge or current spike as described above. Therefore, instead of the product chip 202 receiving the current spike and proportional voltage spike, the PIC 200 receives the current spike. Furthermore, to reduce or minimize the effects of an abnormal increase in current, such as a current spike from an ESD, the PIC 200 makes use of parallel wires or conducting lines where current flows in opposite directions in each of the conducting lines.

Examples of inputs lines to PIC 200 are conducting lines 206(1), 206(2), and 206(3). Conducting lines 206 are laid parallel and as close to one another as possible. Furthermore, adjacent parallel conducting lines 206 have opposing current flow. For example, current in conducting line 206(1) flows opposite to that of conducting line 206(2). By placing conducting lines 206 parallel and as close to one another as possible, and having current flow in opposite directions, the equation voltage=L di/dt is used to reduce the current spike seen at PIC, as further described in detail below.

Product chip 202 provides particular functions used by a system or device (e.g., device 100 of FIG. 1). Examples of such functions include power management, audio/video processing, communications, etc. Product chip 202 is connected or integrated with other ICs or product chips through substrate 204.

Substrate 204 includes trace lines or conductive wires that connect to various components; component inputs and outputs, where such components may be part of the product chip 202 or other product chips. Substrate 204 may also have connections (i.e., trace lines) to ground.

In this example, conducting lines 206 lead from PIC 200 to substrate 204. Conducting lines 206 may lead to ground or ground pins in substrate 204. In certain cases, conducting lines (e.g. conducting lines 206) may share common ground pins. As shown in the isolated drawing of substrate 204, which illustrates the trace lines, the conducting lines 206 are placed parallel to one another for as long possible. In other words, the conducting lines 206 remain parallel to one another, until physically they can no longer be parallel on the substrate 204. Eventually each of the conducting lines 206 ends at distinct contact points on substrate 204.

Figure 3:
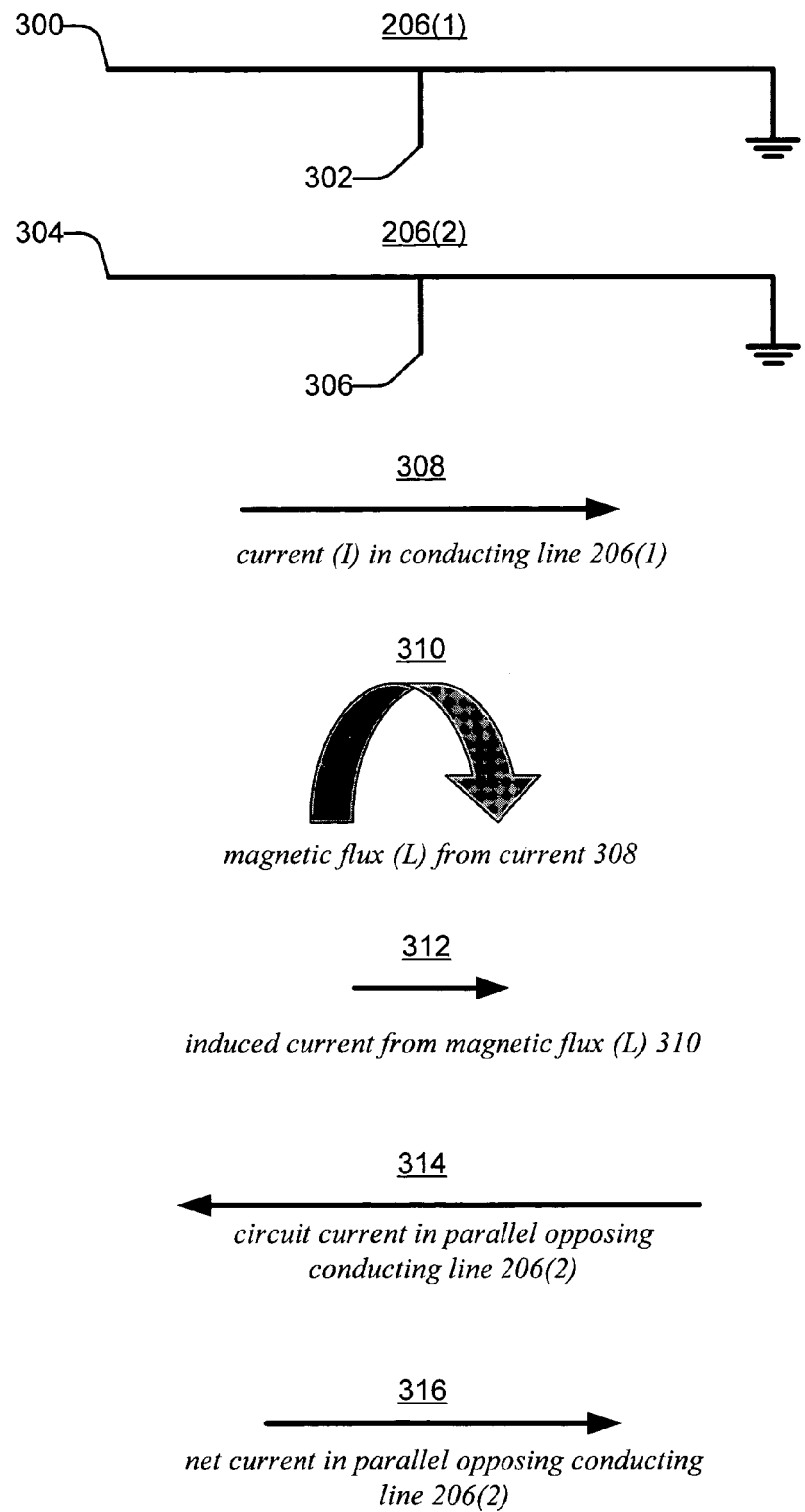
FIG. 3 illustrates a diagram of reducing current in parallel conductive lines in a passives integration chip.

FIG. 3 shows how current is reduced in parallel conductive lines in a PIC such as PIC 200. The wire or conducting line 206(1) includes an input 300 that receives any current spikes from external points of the device. In certain cases, an input to a product chip (e.g., product chip 202) may be provided by conducting line 206(1), as illustrated by output 302. It is expected that in cases where such an output 302 is provided, conducting line 206(1) acts as a shunt for current spikes that could potentially damage the product chip. In this example, conducting line 206(1) ends in a ground point.

Likewise, conducting line 206(2) includes an input 304 that receives any current spikes from external points of the device. In other cases, conducting line 206(2) does not receive any current spikes, but does conduct electricity (i.e., has current flow). In this example, conducting line 206(2) includes an output 306 to a product chip and terminates in a ground point.

Current flowing in conducting line 206(1) is represented directionally and quantitatively by current arrow or current 308. The current 308 includes any current from any current spikes that may be received by conducting line 206(1). A magnetic flux 310 is created by the current 308. The magnetic flux 310 in turn creates an induced current 312 that is seen at parallel conducting lines. To maximize the effect of the induced current 312 upon adjacent conducting lines (e.g. conducting line 206(2)), the conducting lines are placed as close as possible and as described above, remain parallel to one another as long as possible.

A current 314 may be present in conducting line 206(2). The induced current 312 as seen by conducting line 206(2) acts against the current 314. A net current 316 is seen at the conducting line 206(2). Likewise, any current that experienced at conducting line 206(2) has similarly magnetic flux effects upon conducting line 206(1). In other words, conducting line 206(2) can also reduce the current at conducting line 206(1).

Figure 4:
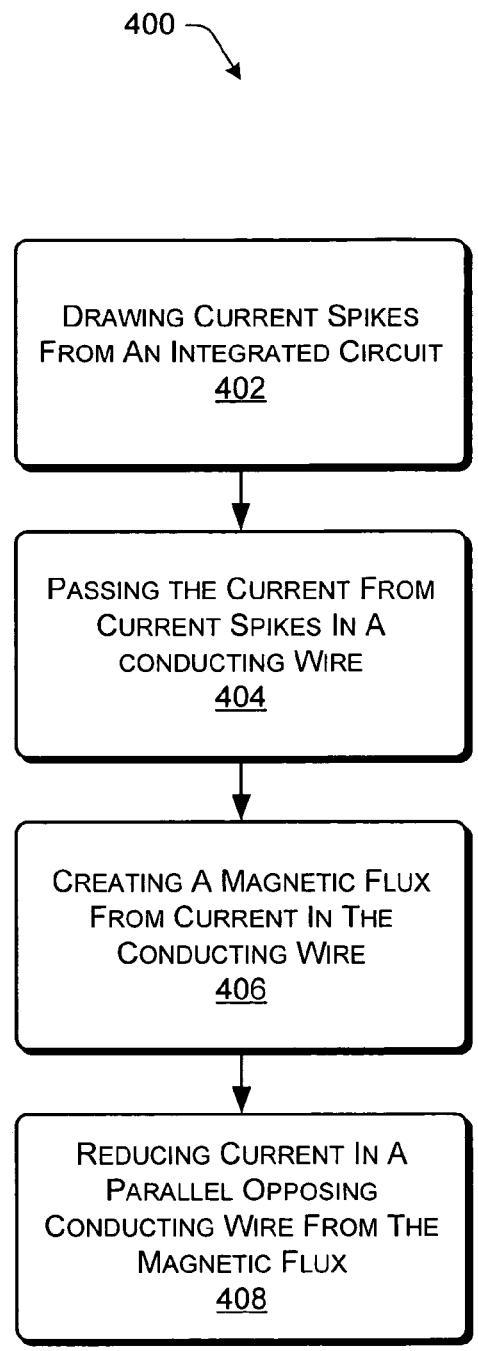
FIG. 4 is a flow diagram that describes steps in a method that protects against current spikes, such as those from electrostatic discharge.

FIG. 4 shows a process 400 that provides for magnetic techniques to address current spikes, such as those from electrostatic discharges (ESD). In particular, in AC coupling mode, a path is provided a DC component or DC signal in a video signal. The process 400 is illustrated as a collection of blocks in a logical flow graph, which represent a sequence of operations that can be implemented in hardware such as described above. Although described as a flowchart, it is contemplated that certain blocks may take place concurrently or in a different order.

At block 402, current surges or current spikes that are received by system or device (e.g., device 100) are drawn away from an integrated circuit or product chip. The drawing of current spikes may be performed by a separate chip, such as PIC 200 described above. In particular, the current spikes are received through one or more external contact points of the system or device.

At block 404, the current from the current spike(s) is passed or sent through a conducting line or wire. The conducting wire may originate from the PIC and lead to a substrate or PCB. The conducting wire may terminate in a ground point which may or may not be on the substrate or PCB.

At block 406, a magnetic flux is created by the current in the conducting wire. In particular, the magnetic flux is resultant from the equation of voltage=L di/dt. The magnetic flux, L, results in an induced current seen at parallel conducting wires that are place in close proximity to the conducing wire that experiences the current spike.

At block 408, current in a parallel conducting wire is reduced. The parallel conducting wire has current flowing opposite to that of the conducting wire in which the current spike is sent or passed. In particular, due to the induced current created by the magnetic flux at the first conducting wire and seen at the second conducting wire, the current in the second wire is reduced. In addition, mutual current reduction is seen at the first conducting wire by the magnetic flux at the second conducting wire.

CONCLUSION

The above-described systems, devices, and methods describe providing magnetic techniques to reduce current and particularly current surges or spikes in integrated circuits and their devices.

Although the invention has been described in language specific to structural features and/or methodological acts, it is to be understood that the invention defined in the appended claims is not necessarily limited to the specific features or acts described. Rather, the specific features and acts are disclosed as exemplary forms of implementing the claimed invention.

What is claimed is:

1. An integrated circuit chip assembly comprising:
   A. a substrate carrying conducting lines, at least two of the conducting lines having one end connected to circuit ground and an opposite end connected to a bond pad, the at least two conducting lines being closely spaced and parallel with one another on the substrate to provide for magnetic coupling of currents flowing in the at least two conducting lines, the substrate carrying additional conducting lines, each having an end connected to a bond pad;
   B. a product integrated circuit chip having a bottom side bound to the substrate and a top side carrying bond pads;
   C. a passives integration chip having a bottom side bound to the top side of the product integration circuit chip and a top side carrying bond pads;
   D. first conducting wires extending between the bond pads on the substrate connected to the at least two conducting lines and bond pads on the passives integration chip;
   E. second conducting wires extending between the bond pads on the substrate connected to the additional conducting lines to bond pads on the product integrated circuit chip; and
   F. third conducting wires extending between the bond pads on the product integrated circuit chip and the bond pads on the passives integration chip.

2. The assembly of claim 1, in which the substrate is a printed circuit board.

3. The assembly of claim 1 in which the at least two conductive lines are connected to circuit ground at distinct contact points separate from one another on the substrate.

4. The assembly of claim 1 in which the product integrated circuit chip is one of a power management chip, an audio/visual processing chip, and a communications chip.

* * * * *